(12) United States Patent
Ayres et al.

(10) Patent No.: US 6,263,461 B1
(45) Date of Patent: Jul. 17, 2001

(54) CIRCUIT FOR EFFICIENTLY TESTING MEMORY AND SHADOW LOGIC OF A SEMICONDUCTOR INTEGRATED CIRCUIT

(75) Inventors: Timothy Ayres, Milpitas; Amitava Majumdar, Fremont; Ajay Khoche, Sunnyvale, all of CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/531,854

(22) Filed: Mar. 21, 2000

Related U.S. Application Data

(63) Continuation of application No. 09/096,860, filed on Jun. 12, 1998, now Pat. No. 6,088,823.

(51) Int. Cl.[7] ............................. G11C 29/00; G01R 31/28
(52) U.S. Cl. ..................... 714/718; 714/727; 714/733
(58) Field of Search .................................. 714/724, 718, 714/726, 727, 729, 733, 734; 324/158.1, 76.11

(56) References Cited

U.S. PATENT DOCUMENTS 3,961,254 * 6/1976 Cavalier et al. .................. 324/158.1
4,070,565 * 1/1978 Borelli ................................ 324/73.1
4,912,395 * 3/1990 Sato et al. ............................ 714/733
5,805,605 * 9/1998 Lee et al. ............................. 714/718

* cited by examiner

Primary Examiner—Emmanuel L. Moise
(74) Attorney, Agent, or Firm—Wagner, Murabito & Hao LLP

(57) ABSTRACT

A circuit for efficiently performing shadow logic testing and memory block testing within a semiconductor integrated circuit. The integrated circuit includes a memory block for storing data. A shadow logic circuit is coupled to the memory block for interfacing the memory block with external circuitry. The shadow logic provides inputs to the memory block and receives data outputs from the memory block. A test collar is coupled between the memory block and the shadow logic. The test collar receives the data inputs from the shadow logic and receives the data outputs from the memory block. The test collar is configured to both provide test inputs to the shadow logic and capture test outputs from the shadow logic independent of the memory block. The test collar is also adapted to both provide tests inputs to the memory block and capture test outputs from the memory block independent of the shadow logic. Thus, the built in test circuit of the present invention is able to perform precise isolated testing on the memory block and perform precise isolated testing on the shadow logic.

14 Claims, 6 Drawing Sheets

US 6,263,461 B1

CIRCUIT FOR EFFICIENTLY TESTING MEMORY AND SHADOW LOGIC OF A SEMICONDUCTOR INTEGRATED CIRCUIT

This application is a continuation of and claims the benefit of application application Ser. No. 09/096,860 filed on Jun. 12, 1998, now U.S. Pat. No. 6,088,823.

FIELD OF THE INVENTION

The field of the present invention pertains to built in self testing of memory integrated circuits. More particularly, the present invention pertains to a method and system for an efficient built in test of an integrated circuit which includes memory.

BACKGROUND OF THE INVENTION

Computer systems, software applications, and the devices and processes built around them are continually growing in power and complexity. Society's reliance on such systems is likewise increasing, making it critical that the systems obey the properties their designers intended. Typically, the more powerful and complex the system, the greater its utility and usefulness. However, as these computer and software implemented systems and processes become more powerful, detecting and correcting flaws within the systems becomes increasingly difficult.

As integrated circuits, and particularly memory integrated circuits, have become more complex and more dense, they have become progressively harder to test in order to ensure correct and complete functionality. For example, with current technology, as memory size increases, the time which a memory integrated circuit (e.g., DRAM) emerging from a fabrication process line spends in testing increases as well. This increase incurs an additional cost on DRAM manufacturing. The testing cost can be very significant for the latest and largest memories. In addition, as more complex systems-on-a-chip devices proliferate, which integrate DRAM with other functions onto a single chip, and as newly designed processors begin to take advantage of the ability to integrate large quantities of memory on-chip, it has become necessary to incorporate elaborate testing circuitry directly into these devices in order to adequately test them.

The incorporated testing circuitry is adapted to test two general areas of the integrated circuit, the memory elements, and the logic/processing elements. For example, in the case of integrated circuits which incorporate both memory and logic, there are usually two main areas which need to be tested, the memory block and the shadow logic surrounding the memory block. The memory block is the circuit structure which stores the actual data, while the shadow logic is the surrounding gates and logic elements needed to interface the memory block with other external circuits. In order to adequately test the DRAM, both areas (e.g., the shadow logic and the memory block) need to be tested. However, in a typical prior art DRAM, the shadow logic is very hard to test independently with respect to the memory block.

In the prior art, the shadow logic (e.g., the logic gates surrounding the memory block) are particularly hard, if not impossible, to precisely test. The shadow logic is hard to test in isolation from the memory block in an efficient manner. Hence, the challenge presented by modern DRAM integrated circuits is that it is difficult to perform an isolated test on the DRAM memory block and an isolated test on the shadow logic. In accordance with the prior art, a built-in test circuit typically tests the memory block and ignores the shadow logic.

In the case of integrated circuits incorporating both memory and logic functions, where there is often no direct connection between external pins and the integrated memory, external testing using external devices can be even more difficult and even more imprecise. Direct access to the embedded memory may not exist. Consequently, to ensure the bits of the memory block are tested adequately, lengthy "test vectors" are required. Because of this, these types of integrated circuits are even more difficult to properly test.

Thus, what is needed is a method for testing the shadow logic without incurring a large silicon area penalty. What is needed is a system which allows an isolated test on the shadow logic and also allows an isolated test on the DRAM. What is further needed is a system to allow isolated testing without incurring excessive silicon area penalties. The present invention provides a novel solution to the above requirements.

SUMMARY OF THE INVENTION

The present invention provides a circuit for testing both the shadow logic and the memory of a semiconductor integrated circuit without incurring a large silicon area penalty. The circuit of the present invention provides the ability to perform isolated testing on the shadow logic and performs isolated testing on the memory. In addition, the circuit of the present invention efficiently provides these capabilities without incurring excessive silicon area penalties.

In one embodiment, the present invention comprises a circuit for efficiently performing shadow logic testing and memory block testing within a semiconductor integrated circuit. The integrated circuit includes a memory block for storing data. A shadow logic circuit is coupled to the memory block for interfacing the memory block with external circuitry. The shadow logic provides inputs to the memory block and receives data outputs from the memory block. A test collar is coupled between the memory block and the shadow logic. The test collar receives the data inputs from the shadow logic and receives the data outputs from the memory block. The test collar is configured to both provide test inputs to the shadow logic and capture test outputs from the shadow logic independent of the memory block. In a similar manner, the test collar is also configured to both provide tests inputs to the memory block and capture test outputs from the memory block independent of the shadow logic. Thus, the built in test circuit of the present invention is able to perform precise isolated testing on the memory block and perform precise isolated testing on the shadow logic.

The components of the test collar of the present invention are multifunctional in that they function during both shadow logic testing mode and memory block testing mode. In so doing, the total gate count of the integrated circuit is reduced and silicon area is conserved. Additionally, the test collar of the present invention provides accessibility to both the memory and the shadow logic even though they may both be deeply embedded within the integrated circuit with no direct access to the input-output pins of the integrated circuit. This advantage is useful in the case of an integrated circuit where one or more memory blocks are embedded with other logic systems, as in, for example, a single-chip computer system.

BRIEF DESCRIPTION OF THE DRAWINGS

The present invention is illustrated by way of example and not by way of limitation, in the figures of the accompanying drawings and in which like reference numerals refer to similar elements and in which.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail as not unnecessarily to obscure aspects of the present invention.

The present invention provides a circuit for testing both the shadow logic and the memory of a semiconductor integrated circuit without incurring a large silicon area penalty. The circuit of the present invention provides the ability to perform isolated testing on the shadow logic and performs isolated testing on the memory. In addition, the circuit of the present invention efficiently provides these capabilities without incurring excessive silicon area penalties.

Figure 1:
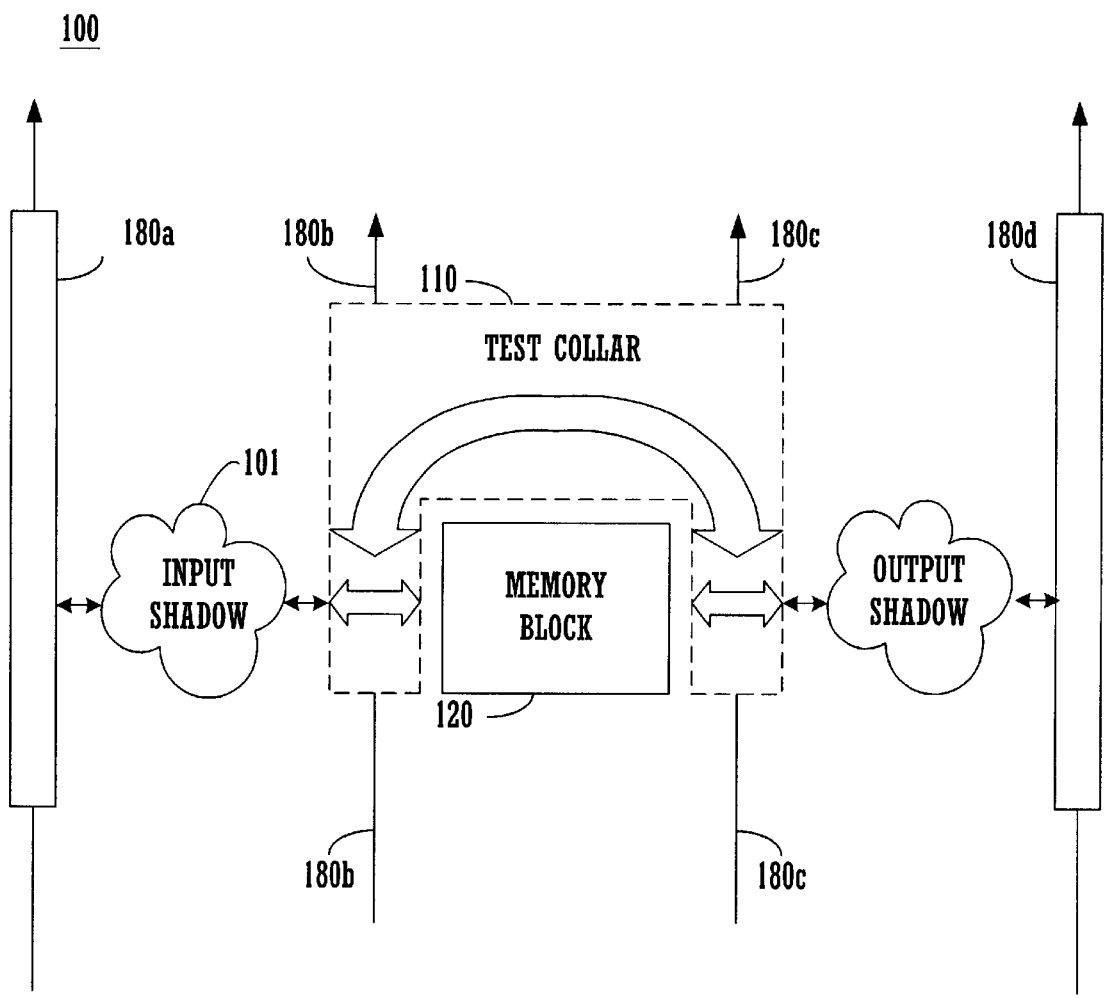
FIG. 1 shows a general diagram of a test collar in accordance with one embodiment of the present invention in relation to a memory block and an input shadow circuit and an output shadow circuit.

Referring now to FIG. 1, a diagram of a system 100 in accordance with one embodiment of the present invention is shown. System 100 includes an input shadow logic 101, an output shadow logic 102, a test collar 110, and a memory block 120. Input shadow logic 101, hereafter referred to input shadow 101, is coupled to memory block 120 via test collar 110. Similarly, output shadow logic 102, hereafter referred to as output shadow 102, is coupled to memory block 120 via test collar 110.

Input shadow 101 and output shadow 102 function by interfacing memory block 120 with other circuits (not shown) within the same integrated circuit. Data from an external device is received by input shadow 101, where it is prepared (e.g., translated into the proper format, buffered, or the like) for storage into memory block 120. Memory block 120 is typically comprised of an array of storage cells, organized to be accessible via column and row addresses. Memory block 120 stores the actual data itself. Output shadow 102 retrieves and interfaces the data from memory block 120 with external circuits. In the latest DRAM integrated circuits, for example, the structure of system 100 is replicated many times over, with each memory block and its associated shadow logic storing a certain amount of data, to provide an aggregate storage capacity of a gigabit or more.

Test collar 110 is coupled between input shadow 101 and output shadow 102 and the memory block 120. Test collar 110 functions by providing accessibility and observabilty to the inputs and outputs of memory block 120. Test collar 110 is used to implement built in test (BIST) functionality for the memory block 120.

FIG. 1 also depicts scan chains 180a, 180b, 180c, and 180d. As used herein, a scan chain is a set of data storage registers which for test mode are configured as a serial shift register for direct access from a tester. Scan chains 180a–180d function by scanning test vectors into and out of system 100. As shown in FIG. 1, scan chains 180a and 180b function by scanning test vector data into and out of input shadow 101 and output shadow 102. Scan chains 180b and 180c function by scanning test vector data into and out of data registers inside test collar 110. In a typical implementation, scan chains 180a–180d are linked to form a single serial scan chain which scans test vectors into and out of the integrated circuit which includes system 100.

Test collar 110, in accordance with the present invention, functions by allowing the detection and observation of errors within memory block 120 independent of the circuitry of the shadow logic. Test collar 110 allows the observation of errors within the memory cells of memory block 120 without requiring the observation to occur through either input shadow 101 or the output shadow 102. In contrast to the prior art, test collar 110 provides for the testing of memory block 120 and the testing of shadow logic (e.g., input shadow 101 and output shadow 102) independent of one another.

For example, to test input shadow 101, test data is scanned into input shadow 101 via scan chain 180a, propagated through the circuits of input shadow 101 and into test collar 110, where it is captured, and then scanned out of test collar 101 via scan chain 180b. To test output shadow 102, test data is scanned into test collar 110 via scan chain 180c, propagated through the circuits of output shadow 102 where it is captured and scanned out via scan chain 180d. To test memory block 120, test data is scanned into test collar 110 via scan chain 180b, applied to memory block 120, subsequently captured by test collar 110, and then scanned out via scan chain 180c. In this manner, test collar 110 of the present invention provides for isolated testing of input shadow 101 and output shadow 102 with respect to memory block 120. In the prior art, a prior art test collar is used to test memory, however, the shadow logic is usually ignored.

To conserve space and maximize efficiency, the system of the present invention uses much of the same logic elements and circuitry of test collar 110 to test both the memory block 120 and the shadow logic (e.g., input shadow 101 and output shadow 102). This same test collar can be used to observe faults in the shadow logic and stimulate the shadow logic. This conserves silicon area and helps reduce the aggregate number of gates of the integrated circuit. This contrasts with the prior art, where no isolated testing was possible, or alternatively, numerous additional registers were added to each input-output pin.

Figure 2:
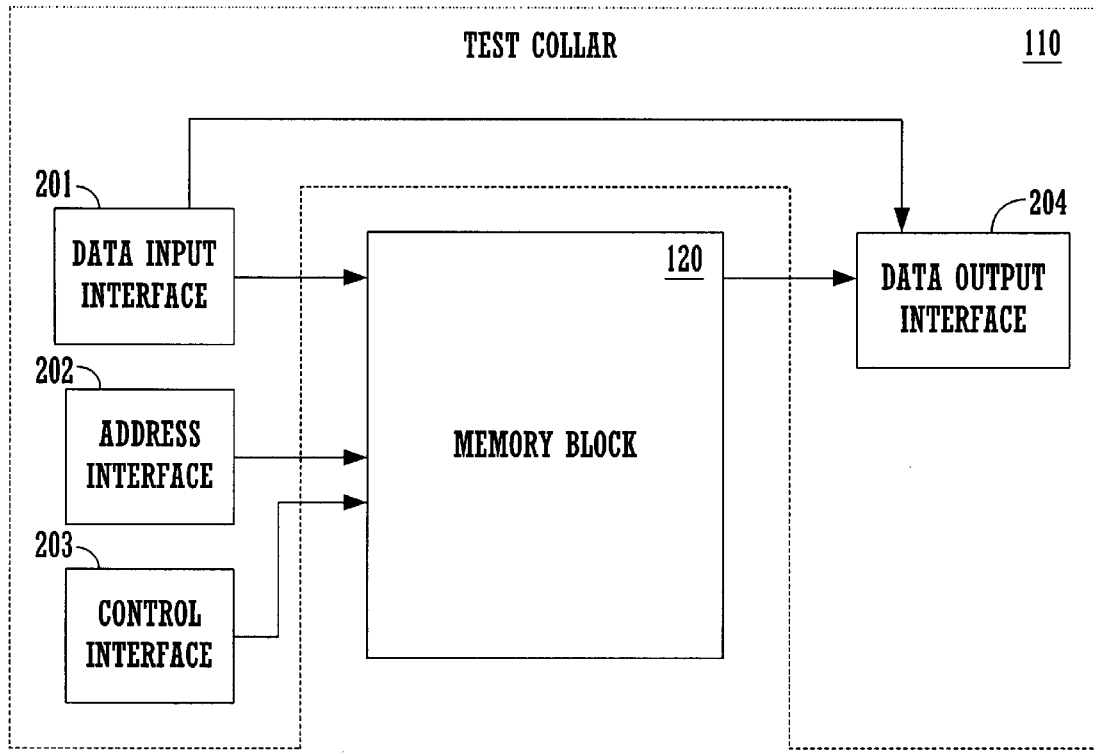
FIG. 2 shows a block diagram of several main components of the test collar of the present invention.

Referring now to FIG. 2, a block diagram showing four general functions of test collar 110 are shown. As shown in FIG. 2, test collar 110 includes a data input interface 201, an address interface 202, a control interface 203, and a data output interface 204.

During normal operation of memory block 120, data input interface 201 functions by interfacing the data from input shadow 101 (shown in FIG. 1) to memory block 120. Data output interface 204 functions by interfacing data from memory block 120 to output shadow 102 (shown in FIG. 1). Address interface 202 receives memory addresses from input shadow 101 and generates the proper addresses for memory block 120. Control interface receives control signals from input shadow 101 which indicate, for example, whether the pending operation is a read or write.

During testing of memory block 120, data input interface 201 sends test data to memory block 120 and the resulting data is read from memory block 120 and captured by data output interface 204. Address interface 202 generates test addresses and control interface 203 generates test control signals for memory block 120.

In accordance with the present invention, during testing of input shadow 101 and output shadow 102, a direct connection between data input interface 201 and data output interface 204 allows greater efficiency in the circuit implementation. The components of test collar 110 are shown in greater detail in FIG. 3 below.

Figure 3:
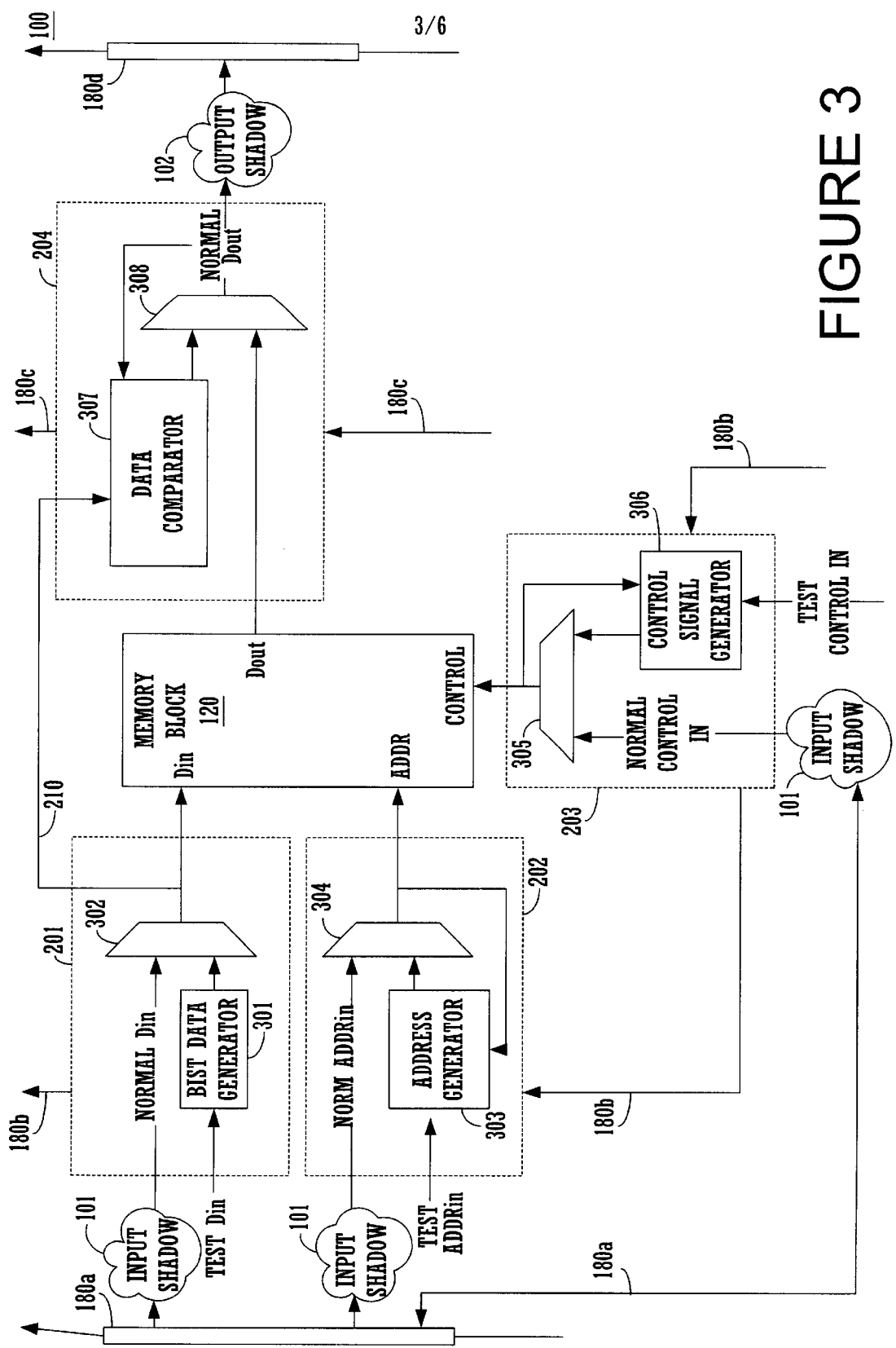
FIG. 3 shows a more detailed diagram of the test collar of the present invention as shown in FIG. 1.

Referring to FIG. 3, system 100 is shown in greater detail. FIG. 3 shows the internal components of data input interface 201, address input interface 202, control interface 203, and data output interface 204. As described above, input shadow 101 is coupled to data input interface 201, address input interface 202, and control interface 203. Output shadow 102 is coupled to data output interface 204. The operation of system 100 during normal operations, the testing of memory block 120, and the testing of input shadow 101 and output shadow 102 are described below.

During normal operation of system 100, data input interface 201 functions by interfacing the data from input shadow 101 (shown in FIG. 1) to memory block 120. Normal data (normal Din) from input shadow 101 is coupled to a data input (Din) of memory block 120 via a multiplexer 302. Address interface 202 receives memory addresses from input shadow 101 (Norm ADDRin) and couples Norm ADDRin to an address input (ADDR) of memory block 120. Control interface 203 receives normal control signals from input shadow 101 which indicate, for example, whether the pending operation is a read or write. The normal control signals are coupled to memory block 120 via a multiplexer 305. Data from memory block 120 is received from a data output (Dout) and is coupled to output shadow 102 by a multiplexer 308 within data output interface 204.

During testing of memory block 120, BIST data generator 301 generates test data (Test Din) based on input from an external built in test controller. Test Din is formatted by BIST data generator and coupled to memory block 120 via multiplexer 302. Address generator 303 generates test address information (Test ADDRin) based on input from the external BIST controller. Test ADDRin is formatted by address generator 303 and is coupled to memory block 120 via multiplexer 304. Control signal generator 306 generates a test control signal (test control in) based on inputs from the external BIST controller. Test control in is formatted by control signal generator 306 and is coupled to memory block 120 via multiplexer 305. Data is subsequently read from memory block 120 to data comparator 307 via multiplexer 308 and line 350. Data comparator 307 compares the data read from memory block with expected data from line 210. This comparison determines whether memory block 120 passes or fails the test. The results of the comparison can be retrieved (e.g., scanned out) from data comparator 307 via scan chain 180c.

During the testing of input shadow 101, test data is applied to input shadow 101 via scan chain 180a. This test data propagates through input shadow 101 and is transmitted to data input interface 201 and address interface 202 and control interface 203 as normal Din and norm ADDRin and Normal control in respectively. Multiplexer 302 of data input interface 201 couples normal Din from input shadow 101 to data comparator 307. Normal Din is received by data comparator 307 via a bypass line 210 and is captured by storage elements (e.g., latches or flip-flops) included within data comparator 307. The captured data is then scanned out from data comparator 307 via scan chain 180c. Multiplexer 304 of address interface 202 couples norm ADDRin from input shadow 101 to address generator 303, where it is captured. The captured data is then scanned out from address generator 303 and control signal generator 306 via scan chain 180b.

During the testing of output shadow 102, a test vector is scanned into registers within data comparator 307 of data output interface 204. This test vector is output from data comparator 307 to output shadow 102 via multiplexer 308. This test vector provides an isolated predefined stimulus to output shadow 102. The test data then propagates through output shadow 102 and is subsequently captured by and scanned out via scan chain 180d. This test data is analyzed with respect to the test vector in order to determine whether output shadow 102 passes the test.

Referring still to FIG. 3, as described above, it should be appreciated that scan chains 180a–180d are typically part of a single serial scan chain linking numerous testing registers, including registers within data comparator 307 and address generator 303, together. The serial scan chain provides the means for inserting and extracting test vectors and other information into and out of the integrated circuit.

It should also be appreciated that, in accordance with the present invention, many of the components of system 100 are multi-functional, in that they are used in testing of memory block 120 as well as the testing of input shadow 101 and output shadow 102. For example, in the case of a prior art memory block which does not implement the capability of isolated shadow logic testing, components such as address generator 303, BIST data generator 301, control signal generator 306 are required in any event for conventional built in self testing. The present invention thus derives it efficiency, in part, from the fact that these types of components are not "duplicated" to provide the ability to test shadow logic. As described above, data input interface 201, address interface 202, and control interface 203 function in both testing memory block 120 and testing input shadow 101 and output shadow 102.

For example, data comparator 307 functions during the testing of input shadow 101 by capturing normal Din received from input shadow 101 and scanning out the captured data via scan chain line 180c. Data comparator 307 also functions during the testing of memory block 120 by comparing Dout with expected data from line 210. This dual use functionality helps reduce the total number of gates in the integrated circuit, thereby conserving silicon area to reduce overall cost. As such, the wiring and circuit pathways used for memory built-in self testing are, to the greatest extent possible, reused for shadow logic testing. In so doing, the multipurpose-purpose nature of the circuits of the present invention provide for testing shadow logic and testing the memory while requiring little more than what is required to perform a conventional memory built-in self test.

It should be appreciated that the circuitry of the present invention provides its benefits and advantages without degrading the performance of the memory array or the shadow logic. No additional delays and no additional latency is imposed upon any of the outputs of the memory array or the shadow logic, in comparison to the prior art.

It should also be appreciated that the term "test collar" as used herein refers to that logic coupled to and surrounding a memory array (e.g., DRAM, SRAM, etc.) which is required to test that specific memory array. Other such terms include "wrapper", "test wrapper", "collar", etc.

Thus, a test collar (e.g., test collar 110) in accordance with the present invention provides sufficient accessibility to allow one testing methodology for the non-memory elements of an integrated circuit and a different testing methodology for the memory elements of the integrated circuit. The circuit pathways which make the collar accessible for memory BIST (e.g., circuit pathways for shifting/scanning test signals in and out of the integrated circuit) are used to provide the same accessibility for shadow logic testing. For example, the logic elements (e.g., multiplexers, switches, etc.) which switch a DRAM integrated circuit into and out of DRAM test mode are used for switching the integrated circuit into and out of shadow logic test mode. This characteristic is very advantageous in the case of an integrated circuit which combines processor-type logic elements (e.g., arithmetic logic units, accumulators, etc.) with memory-type elements (e.g., DRAM memory arrays) and which embeds the memory-type elements deep within the structure of the integrated circuits without a clear means of access (e.g., accessibility to external pins of the integrated circuits).

Figure 4A:
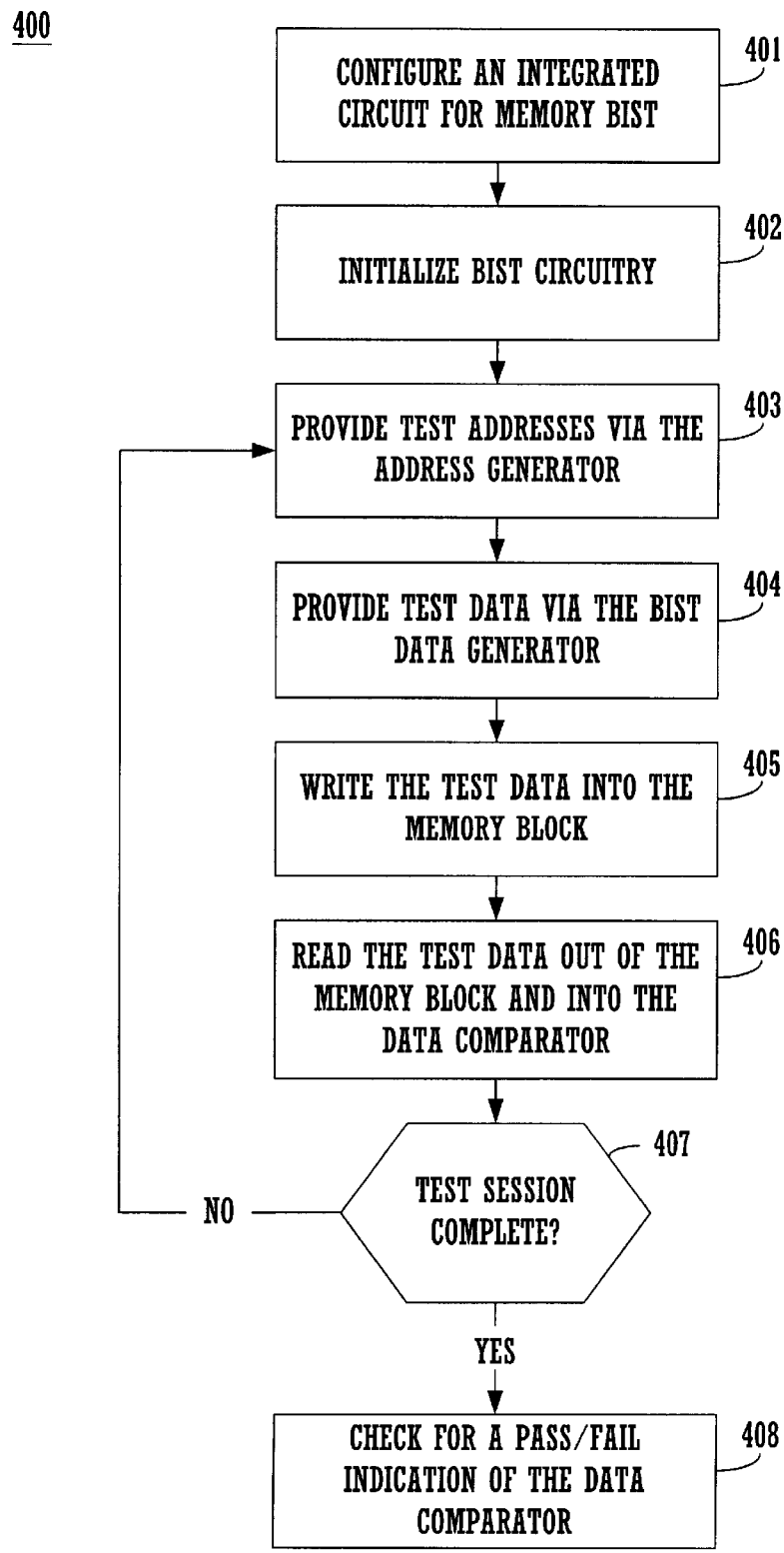
FIG. 4A shows a flowchart of the steps of a memory BIST process in accordance with one embodiment of the present invention.
Figure 4B:
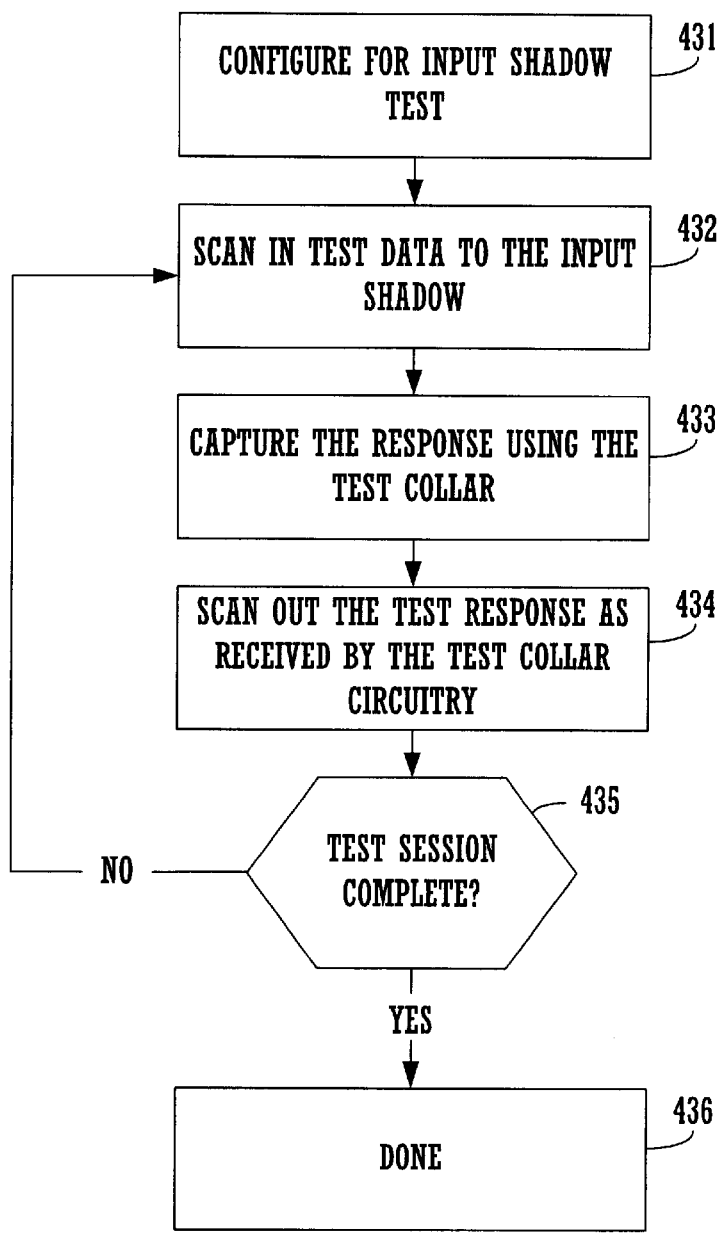
FIG. 4B shows a flowchart of the steps of an input shadow test process in accordance with one embodiment of the present invention.
Figure 4C:
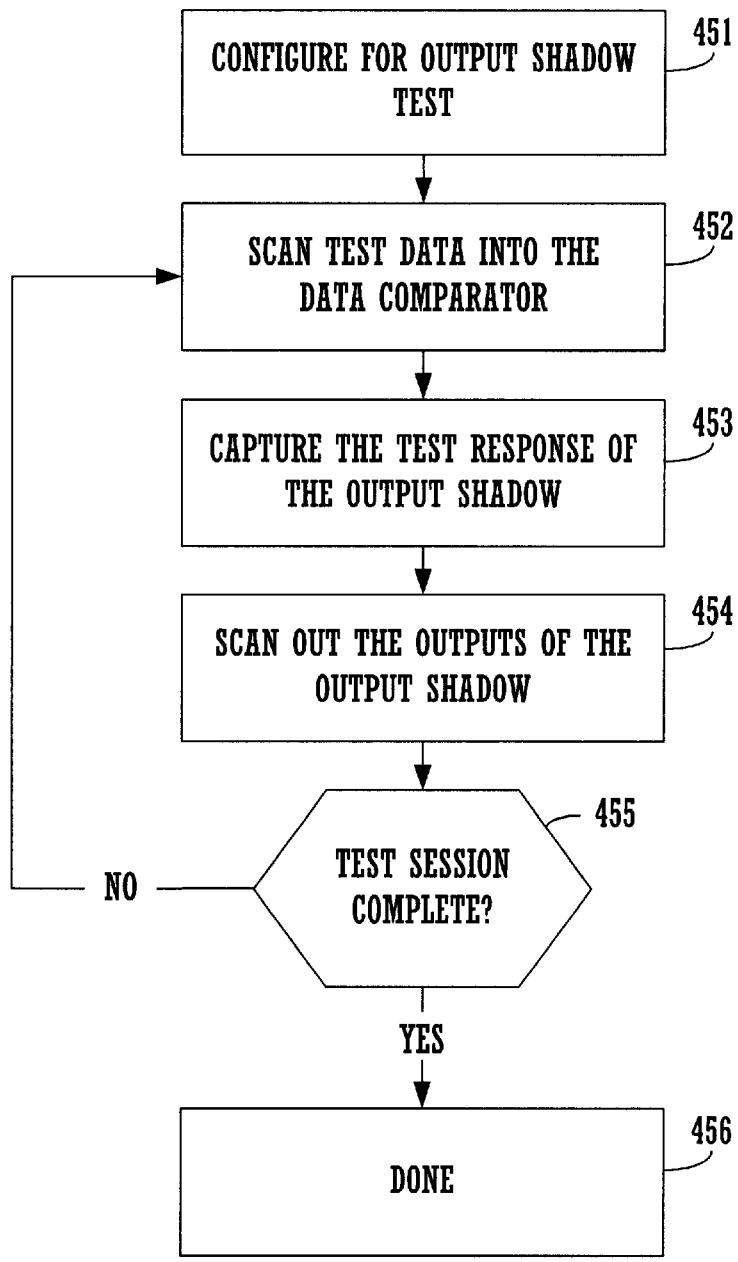
FIG. 4C shows flowchart of the steps of an output shadow test process in accordance with one embodiment of the present invention.

Referring now to FIGS. 4A, 4B, and 4C, flowcharts of the steps of a memory BIST process 400, an input shadow test process 430, and an output shadow process 450 are respectively shown. Process 400 shows the steps of a typical memory BIST process in accordance with the present invention, as executed by an integrated circuit. Process 430 shows the steps of a typical input shadow test process in accordance with the present invention, as executed by an integrated circuit. Similarly, process 450 shows the steps of a typical output shadow test process in accordance with the present invention also as executed by an integrated circuit. It should be appreciated that process 400, process 430 and process 450 are examples of one implementation of the method and system of the present invention. As such, many variations and optimizations are possible, as according to the particular use contemplated (e.g., SRAM device, DRAM device, etc.). It should also be appreciated that process 400, process 430, and process 450 are may be executed sequentially, as the integrated circuit initializes itself for operation. There are no limitations regarding any particular order in which the processes are executed.

Referring to FIG. 4A, the memory BIST process 400 begins in step 401, where an integrated circuit incorporating a circuit in accordance with one embodiment of the present invention (e.g., circuit 100 of FIG. 3) is configured for memory BIST. As described above, each memory block (e.g., memory block 120) of the integrated circuit is configured for testing by configuring data input interface 201, address interface 202, and control interface 203 to respectively couple test data, test addresses, and test control signals to the memory block 120. The data output interface is configured to observed and capture the output of memory block 120.

In step 402, all memory BIST circuitry (including data comparator 307 of data output interface 204 and other components 201, 202, and 203) are initialized to a known state.

In step 403, test addresses are provided via the address generator 303 of the address interface 202. As described above, test addresses (e.g., test ADDRin) are provided to the address generator 303 where they are formatted for and subsequently provided to memory block 120.

In step 404, test data are provided via the BIST data generator 301 of the data input interface 201. As described above, the test data (e.g., test Din) is provided to the BIST data generator 301 where it is formatted for and subsequently provided to memory block 120 or data comparator 307.

In step 405, the test data is written into memory block 120.

In step 406, the test data read from memory block 120. As described above, the test data read from memory block 120 is compared against the test data provided by BIST data generator 301.

In step 407, if the test session is complete, process 400 proceeds to step 408 where the data comparator 307 is checked to determine whether the memory block passed or failed the test. If the test session is not complete, process 400 proceeds back to step 403, and steps 403 through 406 are repeated. Thus, as shown by process 400, an entire sequence of memory locations can be written and read before checking for a pass fail indication, or alternatively, only a certain number (or even a single) of memory locations can be tested and checked immediately thereafter. The particular method chosen depends upon the requirements of the particular implementation (e.g., testing an entire memory array and checking for the existence of an error any where in the array, or isolating an error to a particular memory location).

Referring now to FIG. 4B, the input shadow test process 430 begins in step 431, where circuit 100 of FIG. 3 is configured for input shadow testing. As described above, data input interface 201 is configured to couple normal data (e.g., Normal Din) from input shadow 101 to data comparator 307. Address interface 202 is configured to couple normal addresses (e.g., Norm ADDRin) from input shadow 101 to address generator 303. Control interface 203 couples Normal control in from input shadow 101 to control signal generator 306.

In step 432, test data is provided to the input shadow via scan chain 180a.

In step 433, data from input shadow 101 is captured by data comparator 307, address generator 303, and control signal generator 306 of the test collar 110.

In step 434, the captured test response data is scanned out from test collar 110 (e.g., data comparator 307, address generator 303, and control signal generator 306) and analyzed to determine whether the logic portion of input shadow 101 passes the test.

As shown by step 435, steps 432 through 434 are repeated until the test session is complete, and process 430 thereafter ends in step 436.

Referring now to FIG. 4C, the output shadow test process 450 begins in step 451, where circuit 100 is configured for output shadow testing. As described above, data output interface 204 is configured to couple a test vector directly to the output shadow.

In step 452, test data is scanned into data comparator 307 of data output interface 204 via scan chain 180c.

In step 453, the test data is provided to the output shadow 102 and the response of output shadow 102 is captured using the registers of scan chain 180d. As described above, data comparator 307 couples the test data directly to output shadow 102, having bypassed memory block 120.

In step 454, the captured test outputs are scanned out via scan chain 180d and analyzed to determine whether output shadow 102 passes the test.

As shown in step 455, steps 452 through 454 are repeated until the test session is complete, and process 450 thereafter ends in step 456.

It should be noted that processes 430 and 450 would normally take place simultaneously. In such a case, steps 431 of FIG. 4B and 451 of FIG. 4C would occur simultaneously. In addition, since scan chains 180a–180d are linked, steps 432–434 occur concurrently with steps 452–454.

Thus, the present invention provides a circuit for testing both the shadow logic and the memory of a semiconductor integrated circuit without incurring a large silicon area penalty. The circuit of the present invention provides the ability to perform isolated testing on the shadow logic and performs isolated testing on the memory. In addition, the circuit of the present invention efficiently provides s the capabilities without incurring excessive silicon area penalties.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A built in test circuit for performing shadow logic testing and memory block testing, comprising:
    a test collar coupled between a memory block and a shadow logic to receive data inputs from the shadow logic and data outputs from the memory block;
    the test collar providing a first test input to the shadow logic and capturing a first test output from the shadow logic; and
    the test collar providing a second test input to the memory block and capturing a second test output from the memory block.

2. The circuit of claim 1 wherein the test collar is configured to provide the first test input to the shadow logic and capture the first test output from the shadow logic independent of the memory block.

3. The circuit of claim 1 wherein the test collar is configured to provide the second test input to the memory block and capture the second test output from the memory block independent of the shadow logic.

4. The circuit of claim 1 wherein the test collar further comprises:
    a data input interface coupled to receive the data inputs from the shadow logic;
    a data output interface coupled to receive the data inputs from the shadow logic via the data input interface and provide an isolated test of the shadow logic, wherein the data inputs from the shadow logic are scanned out as the first test output.

5. The circuit of claim 4, wherein the data input interface is coupled to receive test data from an external circuit and provide the test data to the memory block, the data output interface coupled to read the test data from the memory block and provide an isolated test of the memory block by comparing the test data read from the memory block with the test data received from the external circuit and by scanning out the result of the comparison in order to provide an isolated test of the memory block, wherein the result of the comparison is scanned out from the data output interface as the second test output.

6. The circuit of claim 1 wherein the test collar further comprises:
    an address interface coupled to receive an address input from the shadow logic and provide the address input to an address generator, the address interface configured to provide an isolated test of the shadow logic by scanning out the address input received from the shadow logic after the address input propagates through the shadow logic.

7. The circuit of claim 6 wherein the address interface is coupled to receive a test address and couple the test address to the memory block to provide an isolated test of the memory block.

8. The circuit of claim 6 wherein the test collar further comprises:
    a control interface coupled to receive a test control input from an external circuit and couple the test control input to the memory block to provide an isolated test of the memory block.

9. A built in test circuit for performing shadow logic testing and memory block testing, comprising:
    means for interfacing a memory block by using a shadow logic;
    means for providing a first test input to the shadow logic using a test collar coupled to the memory block and the shadow logic;
    means for capturing a first test output from the shadow logic using the test collar to provide an isolated test of the shadow logic;
    means for providing a second test input to the memory block using the test collar; and
    means for capturing a second test output from the memory block using the test collar to provide an isolated test of the memory block.

10. The circuit of claim 9 wherein the test collar is configured to provide the first test input to shadow logic and capture the first test output from the shadow logic independent of the memory block.

11. The circuit of claim 9 wherein the test collar is configured to provide the second test input to the memory block and capture the second test output from the memory block independent of the shadow logic.

12. The circuit of claim 9 further comprising:
    means for providing data inputs from the shadow logic to the memory block and providing data outputs from the memory block to the shadow logic via the test collar to couple the memory block to the shadow logic.

13. The circuit of claim 9, wherein the test collar further comprises:
    a data input interface means coupled to receive the data inputs from the shadow logic; and
    a data output interface means coupled to receive the data inputs from the shadow logic via the data input interface and provide an isolated test of a data portion of the shadow logic by comparing the data input with a test vector received from an external circuit.

14. The circuit of claim 9, wherein the test collar further comprises:

means for receiving an address input from the shadow logic and providing the address input to an address generator, the receiving means configured to provide an isolated test of an address portion of the shadow logic by scanning out the address input received from the shadow logic after the address input propagates through the shadow logic.

\* \* \* \* \*